(12) United States Patent
Li

(10) Patent No.: US 6,657,469 B1
(45) Date of Patent: Dec. 2, 2003

(54) MULTI-SLEW-RATE SWITCHING CIRCUIT

(75) Inventor: Kang Li, Windsor (CA)

(73) Assignee: Yazaki North America, Inc., Canton, MI (US)

( * ) Notice: Subject to any disclaimer, the term of this patent is extended or adjusted under 35 U.S.C. 154(b) by 0 days.

(21) Appl. No.: 10/154,258

(22) Filed: May 23, 2002

(51) Int. Cl.[7] .................................................. H03K 5/12
(52) U.S. Cl. ........................................ 327/170; 327/308
(58) Field of Search ................................. 327/308, 427, 327/434, 530, 538–543, 170

(56) References Cited

U.S. PATENT DOCUMENTS

| | | | |
|---|---|---|---|
| 5,550,446 A | 8/1996 | Schlager et al. | |
| 5,942,935 A | * 8/1999 | Okanobu | 327/553 |
| 5,986,426 A | 11/1999 | Rowan | |
| 6,072,289 A | 6/2000 | Li | |
| 6,084,378 A | 7/2000 | Carobolante | |
| 6,201,417 B1 | 3/2001 | Blum et al. | |
| 6,229,370 B1 | * 5/2001 | Inamori et al. | 327/308 |
| 6,291,960 B1 | 9/2001 | Crombez | |

* cited by examiner

Primary Examiner—Kenneth B. Wells
(74) Attorney, Agent, or Firm—Rader, Fishman & Grauer PLLC

(57) ABSTRACT

An electrical circuit whose slow rate can be changed. Included in the circuit is an input node for applying a voltage signal, a first switch in series with the input node, and a resistance in series with and in-between the input node and first switch. The slew rate of the circuit is adjusted by changing the equivalent resistance between the input node and the first switch based upon a control signal.

17 Claims, 2 Drawing Sheets

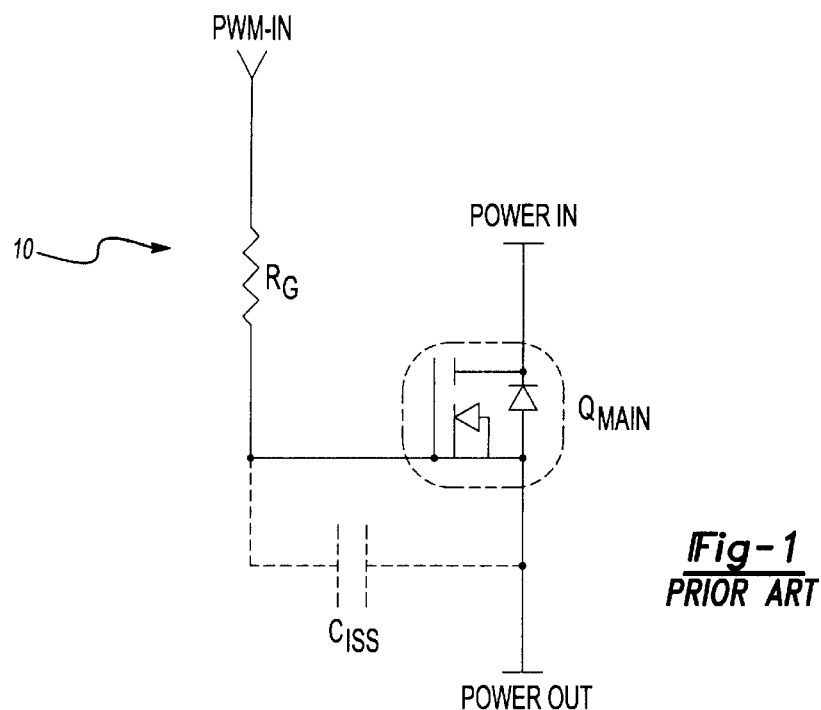
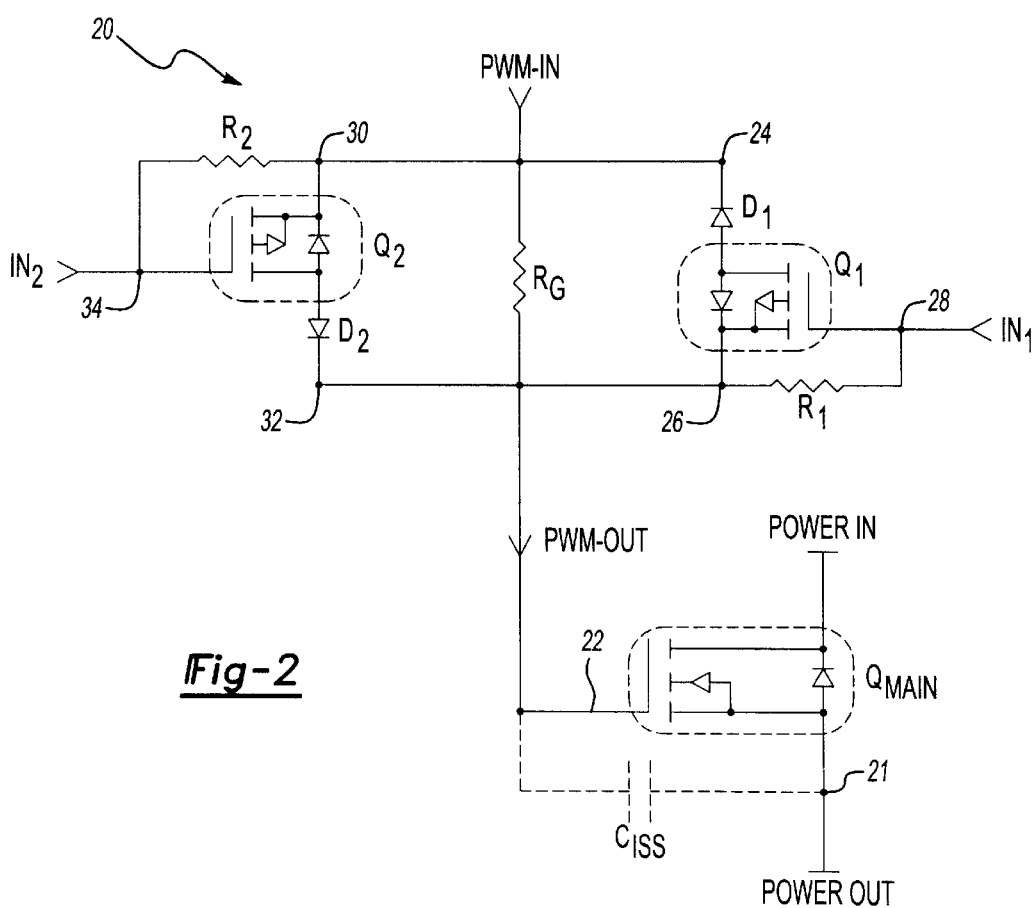
Fig-1
PRIOR ART
Fig-2

MULTI-SLEW-RATE SWITCHING CIRCUIT

TECHNICAL FIELD OF THE INVENTION

The present invention relates generally to voltage slew rates in electronic circuits, and, more specifically, to a new circuit and method for dynamically adjusting the voltage slew rate of an electronic circuit.

BACKGROUND OF THE INVENTION

Many electronic circuits include a voltage input, which can be supplied by various sources of electrical power. As a result of a dynamically-changing input voltage or as a result of various state changes in the electronic circuit, such as switches turning "on" or "off", and changing input parameters to the circuit, the voltage levels at various points throughout the circuit change. However, while a change in input voltage or a change in a state of the electronic circuit is often accomplished according to a step function, such as a switch instantaneously changing from an "on" state to an "off" state, or an input voltage changing instantaneously from a "high" voltage to a "low" voltage, the responding voltage levels throughout the electronic circuit tend not to change instantaneously. The inherent capacitance of most electronic components causes the change in voltage across such components to follow behind the input change. This delayed change in the responsive voltage level is referred to as a "voltage slew rate", and it is defined as the change in voltage level over time.

In the context of pulse-width modulation (PWM) circuits, the voltage slew rate of the circuit is known to affect two undesirable phenomena, specifically, electromagnetic interference (EMI) and power dissipation (switching losses), in opposite ways. These phenomena are of particular interest in a circuit wherein the electronic switches (transistors) change state many times, such as in a pulse-width modulated circuit. Specifically, low voltage slew rates (slow voltage change rates) result in relatively less EMI, but also lead to relatively more power dissipation. Conversely, high voltage slew rates (fast voltage change rates) result in relatively less power dissipation, but also lead to relatively higher levels of EMI. In conventional PWM circuits, the voltage slew rate is optimized for a preferred performance level. The voltage slew rate is adjusted to achieve either the best possible EMI performance while keeping switching losses within a given limit, or, alternatively, the slew rate is adjusted to achieve the smallest possible switching losses while maintaining the EMI level below a maximum value. The voltage slew rate is normally optimized by adjusting the size of various resistors and/or capacitors in the circuit, thereby adjusting the RC time constant, which dictates the length of the voltage slew rate. In a pulse width modulation circuit, the preferred RC time constant depends partially on the frequency of the input voltage to the circuit. For instance, at higher frequencies, the transistors in the circuit change state more often, which translates into a higher preferred slew rate to minimize power dissipation. Conversely, at lower frequencies, the transistors in the circuit change state less often, which translates into a lower preferred slew rate to minimize EMI (since, for lower frequency, larger switching losses are acceptable to keep the average power dissipation within a given limit).

By way of example, a known PWM circuit is shown in FIG. 1. An input voltage signal, PWM-IN, is provided, which causes an electrical current to flow through resistor Rg. The current flows into the gate of transistor Qmain, creating a voltage across the gate and the source which ultimately turns Qmain "on", thereby allowing electrical current to flow therethrough from a power source, "Power In." PWM-IN varies between a "high" voltage and a "low" voltage, and, as a result, Qmain alternatively turns "on" and "off" and the electrical current from the "Power In" source delivers an electrical pulse train to an output load (not shown). Equivalent capacitance Ciss, shown in dotted lines in FIG. 1, is not a physical component in the circuit, but, rather, represents the equivalent capacitance of transistor Qmain. As a result of the equivalent capacitance Ciss (which requires being charged), the voltage level at the gate of Qmain follows the PWM-IN voltage in a delayed manner. The amount of the delay, or "slew", is determined by the RC time constant, $\tau$, which is mathematically determined according to the following: $\tau = Rg * Ciss$. Depending upon the frequency of the input voltage, PWM-IN, the RC time constant can be adjusted by adjusting the values of Rg and/or Ciss.

The above-described methodology of optimizing the voltage slew rate of a pulse modulation circuit works adequately when the frequency of the circuit is a constant. However, if the PWM circuit is intended to operate on a variety of frequencies, then the above-methodology is less desirable because the voltage slew rate must be designed to accommodate the highest possible frequency in the system. As a result, the system suffers either unnecessarily high EMI levels when the system is operated at relatively low frequencies, or the system must unnecessarily incorporate over-sized switching transistors (Qmain in FIG. 1) to accommodate the high power dissipation when the system is operated at relatively high frequencies. In either case, the system is not optimized.

Therefore, the inventors hereof have recognized the need for a new circuit and method for dynamically adjusting the voltage slew rate of an electronic circuit.

SUMMARY OF THE INVENTION

The present invention relates to a new circuit and method for adjusting the voltage slew rate of an electronic circuit. In particular, the inventive circuit includes a means for dynamically controlling the equivalent resistance of the electronic circuit. In one embodiment of the invention, the equivalent resistance of the circuit is adjusted in response to at least one control signal.

BRIEF DESCRIPTION OF THE DRAWINGS

FIG. 1 illustrates a known pulse-width modulated (PWM) circuit.

FIG. 2 is a circuit diagram that illustrates an embodiment of the present invention.

DETAILED DESCRIPTION OF AN EMBODIMENT OF THE INVENTION

Figure 3:
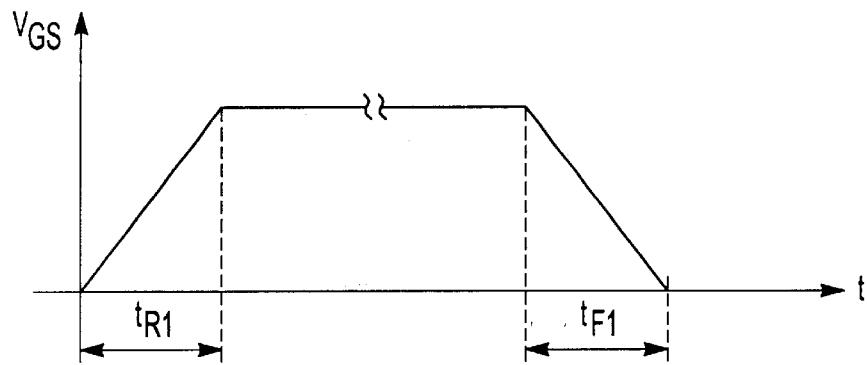
FIG. 3 is an illustrative graphical representation of the voltage slew rate when the embodiment of the invention illustrated in FIG. 2 is operated in a "slow on, slow off" mode.

FIG. 2 illustrates one embodiment of an adjustable slew rate pulse-width modulated circuit in accordance with the present invention. Though described herein in connection with a PWM circuit, the invention may be used with other types of circuits where it is desirable to be able to dynamically adjust the slew rate of the circuit.

In FIG. 2, a PWM-IN terminal is present for receiving an input signal indicative of the pulse train desired to be output by the circuit. Generally, the PWM-IN signal alternates between a "high" signal and a "low" signal.

In one embodiment of the invention used in an automobile setting, the "high" signal corresponds to the application of approximately 52V to the PWM-IN terminal, and the "low" signal corresponds to the application of approximately 0V to the PWM-IN terminal.

As in conventional PWM circuits, the "high" signal at the PWM-IN terminal causes electrical current to flow through resistor Rg to the gate (terminal 22) of transistor Qmain. Transistor Qmain has an inherent input capacitance, Ciss. In FIG. 2, the inherent capacitance Ciss is shown in dotted lines, but Ciss is not a physical component of the circuit. Rather, Ciss is explicitly shown in FIG. 2 to better illustrate the inherent capacitance of the transistor Qmain. A primary function of Qmain is to alternatively connect and disconnect the POWER IN terminal to a load device, illustrated in FIG. 2 as the POWER OUT terminal, in response to the input signal PWM-IN. The transistor, Qmain, illustrated in FIG. 2 is a field effect transistor (FET), but other types of transistors can be used as well. Similarly, other electrical devices having a resistance could be substituted for Rg and remain within the scope of this invention. The particular specifications of the transistor Qmain and the resistor Rg can be tailored to meet the needs of the particular application.

To dynamically adjust the voltage slew rate of the circuit, the RC time constant that determines the slew rate must be capable of being dynamically adjusted. In conventional PWM systems, the RC time constant was fixedly determined at the time of manufacture based upon the value of resistor Rg and the value of the inherent capacitance, Ciss, of Qmain. As illustrated by this particular embodiment of the invention, the RC time constant is dynamically adjusted by changing the equivalent resistance in the circuit based upon input signals IN1 and IN2. Specifically, a first conductive path is established in parallel to resistor Rg comprising transistor Q1 and diode D1. Control signal IN1 is connected to the gate of Q1 to selectively turn Q1 "on" and "off." When Q1 is turned "on", electrical current is able to flow through Q1 and D1 from reference numeral 26 to reference numeral 24. When Q1 is turned "off", no electrical current flows in this conductive path. A resistor R1 is connected between the source (reference numeral 26) of Q1 and the gate (reference numeral 28) of Q1 and is used in conjunction with control signal IN1 for controlling a voltage across the gate of Q1. Additionally, a second conductive path is established in parallel to resistor Rg comprising transistor Q2 and diode D2. Control signal IN2 is connected to the gate of Q2 to selectively turn Q2 "on" and "off." When Q2 is turned "on", electrical current is able to flow through Q2 and D2 from reference numeral 30 to reference numeral 32. When Q2 is turned "off", no electrical current flows in this conductive path. A resistor R2 is connected between the gate (reference numeral 34) and the source (reference numeral 30) of Q2 and is used in conjunction with control signal IN2 for controlling a voltage across the gate of Q2.

In operation, a "high" input signal PWM-IN causes electrical current to flow through resistor Rg and to the gate (reference numeral 22) of transistor Qmain. The electrical current charges the inherent capacitance Ciss, at the completion of which, the transistor Qmain is completely turned "on." When the input voltage is removed from the PWM-IN terminal, the input signal PWM-IN goes to "low", which allows the inherent capacitance Ciss of transistor Qmain to discharge through resistor Rg. Once the inherent capacitance is discharged, transistor Qmain is completely "off."

The RC time constant, which determines the amount of time required for the transistor Qmain to turn "on" and turn "off", is adjusted by changing the equivalent resistance of the circuit through control signals IN1 and IN2. When Q2 is turned "on", the conductive path through Q2 and D2 is implemented in parallel to resistor Rg. Because the inherent resistance through Q2 and D2 is relatively low, the equivalent resistance between PWM-IN and PWM-OUT is reduced when PWM-IN is "high." However, because D2 prevents current from flowing from reference numeral 32 to reference numeral 30, the equivalent resistance between PWM-OUT and PWM-IN is not changed when PWM-IN is "low." Thus, the RC time constant, and thus the time required to charge up the inherent capacitance Ciss of Qmain, is reduced, but the time required to discharge the inherent capacitance is not changed. In similar fashion, when Q1 is turned "on", the conductive path through Q1 and D1 is implemented in parallel to resistor Rg. Because the resistance through Q1 and D1 is relatively low, the equivalent resistance between PWM-OUT and PWM-IN is reduced when PWM-IN is "low" and Ciss is being discharged. However, because D1 prevents current from flowing from reference numeral 24 to reference numeral 26, the equivalent resistance between PWM-IN and PWM-OUT is not changed when PWM-IN is "high" and Ciss is being charged. Therefore, the RC time constant, and thus the time required to discharge the inherent capacitance, Ciss, of Qmain, is reduced, but the time required to charge up the inherent capacitance is not changed.

In the embodiment shown in FIG. 2, there are four combinations of control signals IN1 and IN2 being "on" and "off", with each combination corresponding to a different mode of operation. The following table sets forth the different combinations of control signals IN1 and IN2 and their corresponding modes of operation.

|  | IN1 | IN2 | Mode of Operation |
| --- | --- | --- | --- |
| 1. | "off" | "off" | Slow on, Slow off |
| 2. | "off" | "on" | Fast on, Slow off |
| 3. | "on" | "off" | Slow on, Fast off |
| 4. | "on" | "on" | Fast on, Fast off |

The "slow on, slow off" mode refers to a mode of operation wherein neither Q1 nor Q2 is turned "on", so the transistor Qmain turns "on" relatively slowly and turns "off" relatively slowly. The "fast on, slow off" mode refers to a mode of operation wherein input signal IN2 is "on" and input signal IN1 is "off", so the transistor Qmain turns "on" relatively quickly (because the equivalent resistance in the circuit is reduced) but turns "off" relatively slowly. Similarly, the "slow on, fast off" mode refers to a mode of operation wherein input signal IN2 is "off" and input signal IN1 is "on", so that transistor Qmain turns "on" relatively slowly but turns "off" relatively quickly. Finally, the "fast on, fast off" mode refers to a mode of operation wherein both input signals IN2 and IN1 are "on", so the transistor Qmain turns "on" and turns "off" relatively quickly.

Now, the four modes of operation will be described in more detail. In the "slow on, slow off" mode of operation, the input signals IN1 and IN2 are both "off." Therefore, their respective transistors Q1 and Q2 are "off." Because no current flows through either Q1 or Q2, the effective resistance of the circuit is Rg. When a "high" input voltage is applied to PWM-IN, the transistor Qmain does not turn "on" instantaneously. Rather, current flows from PWM-IN through Rg to charge the inherent capacitance of Qmain. The Qmain is gradually turned on depending upon the voltage across the Ciss (corresponding gate-source voltage Vgs). Once the inherent capacitance is charged, Qmain is completely turned "on", and thus, electrical current is allowed to flow from the Power In terminal to the load device at the Power Out terminal. When the "high" PWM-IN signal is removed (changed to "low"), the inherent capacitance, Ciss, prevents transistor Qmain from turning "off" instantaneously. Rather, Qmain completely turns off only after the voltage across the inherent capacitance, Ciss, is under a certain voltage (called a threshold voltage), while Ciss is discharged through resistor Rg.

FIG. 3 graphically illustrates the gate voltage, Vgs (voltage between the gate (22) and source (21) of Qmain), as Qmain turns "on" and turns "off." As indicated, $\tau_{r1}$ represents the RC time constant for Qmain to turn "on", and $\tau_{f1}$ represents the RC time constant for Qmain to turn "off." In this operating mode, $\tau_{r1}$ and $\tau_{f1}$ are equal, and, compared to other operating modes (described hereinafter), $\tau_{r1}$ and $T_{f1}$ are relatively long. Mathematically, $\tau_{r1}$=Rg*Ciss, and $\tau_{f1}$= Rg*Ciss.

In the "fast on, slow off" mode of operation, the input signal IN1 is "off" and the input signal IN2 is "on." Therefore, Q1 is "off" and Q2 is "on." As a result, the current from PWM-IN can flow through Q2 and D2, as well as Rg, which results in a downwardly-adjusted equivalent resistance, and thus, a smaller RC time constant when PWM-IN is "on." On the other hand, because Q1 is "off", no current can flow through Q1 and D1. Further, even though Q2 is "on", diode D2 prevents discharge current from flowing from reference numeral 32 to reference numeral 30. Therefore, the resistance remains Rg when PWM-IN is "off." As a result, the current from the discharge of inherent capacitance Ciss passes only through Rg, and thus, the equivalent resistance remains Rg.

Figure 4:
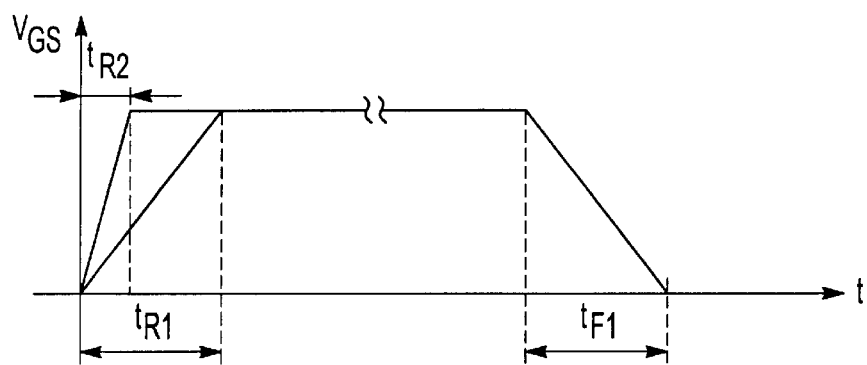
FIG. 4 is an illustrative graphical representation of the voltage slew rate when the embodiment of the invention illustrated in FIG. 2 is operated in a "fast on, slow off" mode.

FIG. 4 graphically illustrates the gate-source voltage, Vgs (voltage between the gate (22) and source (21) of Qmain), as Qmain turns "on" and turns "off" during the "fast on, slow off" mode of operation. As indicated, $\tau_{r1}$ represents the RC time constant for Qmain to turn "on" in "slow mode" (illustrated for comparison purposes); $\tau_{r2}$ represents the RC time constant for Qmain to turn "on" in "fast mode"; and $\tau_{f1}$ represents the RC time constant for Qmain to turn "off." In this operating mode, $\tau_{r2}$ is shorter than $\tau_{r1}$, so it takes less time for Qmain to turn "on" than it does in the "slow on" mode. Further, $\tau_{r2}$ is shorter than $\tau_{f1}$, so it takes less time for Qmain to turn "on" than it does for Qmain to turn "off." Mathematically, $\tau_{r2}$=(Req*Ciss), where Req represents the equivalent resistance of Rg being in parallel with the inherent resistance of Q2. As before, $\tau_{f1}$=Rg*Ciss.

In the "slow on, fast off" mode of operation, the input signal IN1 is "on" and the input signal IN2 is "off." Therefore, Q1 is "on" and Q2 is "off." As a result, the discharge current from Ciss can flow through Q1 and D1, as well as Rg, which results in a downwardly-adjusted equivalent resistance, and thus, a smaller RC time constant when PWM-IN is "off." On the other hand, because Q2 is "off", no current can flow through Q2 and D2, and D1 prevents charging current from flowing from reference numeral 24 to reference numeral 26. Therefore, the resistance remains Rg when PWM-IN is "on." As a result, the current from a "high" PWM-IN signal passes only through Rg.

Figure 5:
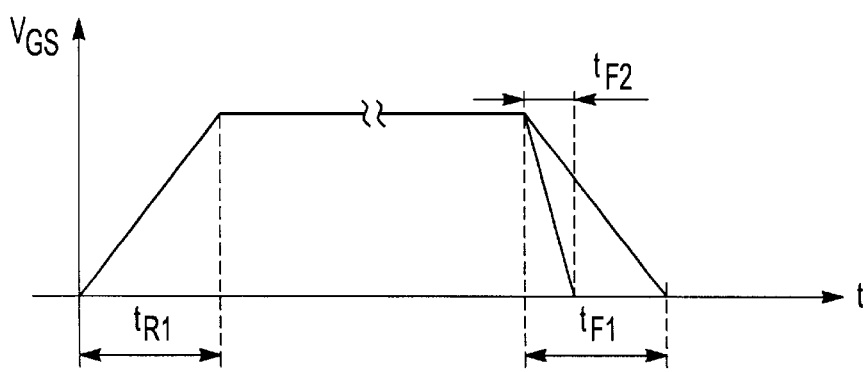
FIG. 5 is an illustrative graphical representation of the voltage slew rate when the embodiment of the invention illustrated in FIG. 2 is operated in a "slow on, fast off" mode.

FIG. 5 graphically illustrates the gate-source voltage, Vgs (voltage between the gate and source of Qmain), as Qmain turns "on" and turns "off" during the "slow on, fast off" mode of operation. As indicated, $\tau_{r1}$ represents the RC time constant for Qmain to turn "on"; $\tau_{f1}$ represents the RC time constant for Qmain to turn "off" in "slow mode" (illustrated for comparison purposes); and $\tau_{f2}$ represents the RC time constant for Qmain to turn "off" in "fast mode." In this operating mode, $\tau_{f2}$ is shorter than $\tau_{r1}$, so it takes less time for Qmain to turn "off" than it does for Qmain to turn "on." Mathematically, $\tau_{r1}$=(Rg*Ciss), and $\tau_{f2}$=(Req*Ciss), where Req represents the equivalent resistance of Rg being in parallel with the inherent resistance of Q1.

Finally, in "fast on, fast off" mode, both IN1 and IN2 are "on", and thus, both Q1 and Q2 are "on." As a result, the circuit resistance is downwardly-adjusted both when the PWM-IN is "on" (and charging Qmain) and when the PWM-IN is "off" (and discharging Qmain). Therefore, Qmain turns "on" according to the RC constant $\tau_{r2}$ and turns "off" according to the RC constant $\tau_{f2}$ illustrated in FIGS. 4 and 5.

Using the present invention, the voltage slew rate can be dynamically controlled, and thus, the slew rate can be adjusted to better accommodate multiple frequencies in a PWM circuit. For example, for a given-sized transistor Qmain, the slew rate can be adjusted upward when the input frequency to the circuit is higher. The faster slew rate is desirable at higher frequencies to reduce the power dissipation, even at the expense of somewhat higher EMI levels. Conversely, the slew rate can be adjusted downward when the input frequency to the circuit is lower to improve the EMI levels when the larger switching losses can be tolerable (because of the lower switching frequency). Further, to reduce the heat generated by the circuit (as a result of the power dissipation), the slew rate can be increased. In these ways, the PWM circuit can be optimized for various input frequencies.

While the invention has been described above in connection with a particular embodiment, the invention is not limited to such embodiment. One skilled in the art will readily recognize other embodiments that fall within the scope of the invention. By way of example only, additional current paths, similar to those defined by Q1 and D1, and Q2 and D2, parallel to Rg could be added and controlled by additional input signals. Additional such current paths would facilitate more precise control of the slew rate. Similarly, an alternative embodiment of the invention could include just one parallel circuit path like either that through Q2 and D2 or that through Q1 and D1. A single parallel circuit path could be using to adjust the slew rate either for Qmain turning "on" or turning "off", but not both. If one simply wanted the ability to adjust the slew rate to a value that applied to both the turning "on" and "of" of Qmain, a parallel circuit path that did not include a diode could be utilized. In essence, the invention may include any number of parallel circuit paths that can be used to adjust the equivalent resistance of the circuit. Additionally, other electrical components having resistances, such as resistors, could be included in the various parallel circuit paths to adjust the equivalent resistance of the entire circuit when the parallel circuit path is turned "on." Further, other methods of adjusting the equivalent resistance of the circuit to adjust the circuit slew rate can be used.

Although the embodiments described above call for the use of field-effect transistors, such as metal-oxidesemiconductor field-effect transistors (MOSFETS), the present invention is not limited to this type of device as the mechanism for controlling the functional circuit paths. Alternatively, devices such as isolated gate bipolar transistors (IGBTs) and bipolar power transistors could also be effectively utilized.

While the invention has been specifically described in connection with certain specific embodiments thereof, it is to be understood that this is by way of illustration and not of limitation, and the scope of the appended claims should be construed as broadly as the prior art will permit.

What is claimed is:

1. An electrical circuit, comprising:
   an input node for receiving a varying voltage signal;
   a first switch;
   a resistor connected in series between said input node and said first switch;
   a first device having a resistance connected in parallel with said resistor; and
   a diode connected in series with said first resistance device;
   wherein said resistor is adapted to be selectively adjusted in response to a control signal.

2. The circuit of claim 1, wherein said first switch is a transistor.

3. The circuit of claim 1, wherein said first resistance device comprises a switch.

4. The circuit of claim 1, wherein said first resistance device comprises a transistor.

5. The circuit of claim 1, wherein said first resistance device causes an equivalent resistance between said input node and said first switch to be adjusted in response to said control signal.

6. An electrical circuit, comprising:
   an input node for receiving a varying voltage signal;
   a first switch;
   a resistor connected in series between said input node and said first switch;
   a first device having a resistance connected in parallel with said resistor; and
   a second device having a resistance connected in parallel with said resistor;
   wherein said resistor is adapted to be selectively adjusted in response to a control signal.

7. The circuit of claim 6, wherein said first and second resistance devices comprise switches.

8. The circuit of claim 6, wherein said first and second resistance devices comprise transistors.

9. The circuit of claim 7, further comprising:
   a first means for preventing current from flowing through said first resistance device from said input node toward said first switch; and
   a second means for preventing current from flowing through said second resistance device from said first switch toward said input node.

10. A method of adjusting a slew rate of a circuit, comprising:
    providing a varying voltage level input signal to an input node of the circuit, wherein said input voltage level controls a switch;
    adjusting an equivalent resistance between said input node and said switch in response to a first control signal when current flows from said input node to said switch; and
    adjusting said equivalent resistance between said input node and said switch in response to a second control signal when current flows from said switch to said input node.

11. The method of claim 10, wherein said step of adjusting an equivalent resistance in response to said first control signal and said step of adjusting an equivalent resistance in response to said second control signal comprise a step of permitting current to flow through selected parallel current paths between said input node and said switch.

12. A circuit, comprising:
    an input node for applying a varying voltage signal;
    a first switch;
    a resistor connected in series between said input node and said first switch providing a first current path between said input node and said first switch; and
    a second current path connected in parallel to said resistor and comprising a second switch that is responsive to a first control signal;
    wherein current is selectively permitted to flow through said second current path in response to said first control signal.

13. The circuit of claim 12, wherein said second switch is a transistor.

14. The circuit of claim 12, further comprising a third current path connected in parallel to said resistor and adapted to selectively permit current to flow through said third current path in response to a second control signal.

15. The circuit of claim 14, further comprising:
    a first diode connected in said second current path to prevent current from flowing in said second current path from said input node to said first switch; and
    a second diode connected in said third current path to prevent current from flowing in said third current path from said first switch to said input node.

16. A circuit allowing adjustment of a slew rate, comprising:
    an input node for receiving a pulse width modulated signal;
    a first switch controlled by said pulse width modulated signal;
    a first circuit path having a first resistance and connecting said input node to said first switch; and
    at least one supplemental circuit path having a second resistance and running in parallel to said first circuit path;
    wherein in response to a control signal, said at least one supplemental circuit path can be selectively placed in one of a first, inactive state and a second, active state, with current being unable to flow through said at least one supplemental circuit path when said at least one supplemental circuit path is in said inactive state, and current being able to flow in one of a first and second direction through said at least one supplemental circuit path when said supplemental circuit path is in said active state.

17. The circuit according to claim 16, wherein said at least one supplemental circuit path comprises first and second supplemental circuit paths, and wherein current can only flow in said first direction through said first supplemental circuit path when said first supplemental circuit path is in said active state, and current can only flow in said second direction, opposite to said first direction, through said second supplemental circuit path when said second supplemental circuit path is in said active state.

* * * * *

UNITED STATES PATENT AND TRADEMARK OFFICE
CERTIFICATE OF CORRECTION

PATENT NO. : 6,657,469 B1
DATED : December 2, 2003
INVENTOR(S) : Kang Li

It is certified that error appears in the above-identified patent and that said Letters Patent is hereby corrected as shown below:

<u>Title page,</u>
Item [57], ABSTRACT,
Line 1, delete "slow" and insert -- slew --

Signed and Sealed this

Thirteenth Day of January, 2004

JON W. DUDAS
*Acting Director of the United States Patent and Trademark Office*